(12) United States Patent
Wendler et al.

(10) Patent No.: US 10,877,094 B2
(45) Date of Patent: Dec. 29, 2020

(54) COMMAND RECORDING ARRANGEMENT AND COMMAND RECORDING METHOD

(71) Applicant: Rohde & Schwarz GmbH & Co. KG, Munich (DE)

(72) Inventors: Wolfgang Wendler, Gröbenzell (DE); Florian Lang, Gilching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 58 days.

(21) Appl. No.: 16/108,445

(22) Filed: Aug. 22, 2018

(65) Prior Publication Data
US 2020/0064403 A1    Feb. 27, 2020

(51) Int. Cl.
*G01R 31/319* (2006.01)
(52) U.S. Cl.
CPC . *G01R 31/31907* (2013.01); *G01R 31/31905* (2013.01); *G01R 31/31922* (2013.01); *G01R 31/31926* (2013.01)

(58) Field of Classification Search
CPC ........ G01R 31/31907; G01R 31/31922; G01R 31/31926; G01R 31/31905
See application file for complete search history.

(56) References Cited

U.S. PATENT DOCUMENTS

| | | |
|---|---|---|
| 9,377,488 B2 | 6/2016 | Braunstorfinger et al. |
| 2016/0357377 A1* | 12/2016 | Thimbleby ........... G06F 40/166 |
| 2017/0249940 A1* | 8/2017 | Chen ........................ G06F 3/167 |
| 2017/0353731 A1* | 12/2017 | Wade ................... H04N 19/436 |
| 2018/0270297 A1* | 9/2018 | Meng ..................... H04L 67/10 |

* cited by examiner

*Primary Examiner* — Thien Nguyen
(74) *Attorney, Agent, or Firm* — Westman, Champlin & Koehler, P.A.

(57) ABSTRACT

Recording of a control command sequence related to multiple devices. Each of the multiple devices may receive user input by a user inter-face, and the received user input may be converted to appropriate control commands. Timestamp information is assigned to each control command, and the control commands of the multiple devices are merged together to a common control command sequence based on the assigned timestamp information.

19 Claims, 3 Drawing Sheets

COMMAND RECORDING ARRANGEMENT AND COMMAND RECORDING METHOD

TECHNICAL FIELD

The present invention relates to a command recording arrangement for generating a control command sequence. The present invention further relates to a command recording method.

BACKGROUND

Although applicable in principle to any test arrangement, the present invention and its underlying problem will be hereinafter described in combination with testing a wireless radio-frequency device.

In modern days electronic devices are used in a growing number of applications. For example, the number of wireless communication devices continuously increases.

During development or production of electronic devices, for example wireless communication devices, it is necessary to thoroughly test these devices for compliance with communication standards and legal regulations.

U.S. Pat. No. 9,377,488 B2 discloses a generation of a remote-control sequence for measuring devices. In particular, control commands for parameters are generated for controlling a single measurement device.

However, testing modern electronic devices, especially communication devices, may require test scenarios with more than a single measurement device. For example, a test scenario may require a signal source for applying a predetermined test signal to a device under test and a measurement device for measuring a response of the device under test when applying the test signal. In test scenarios which require more than one device, the operation of the individual devices has to be synchronized. For example, the generation of a test signal has to be synchronized with the start and the stop of a measurement operation performed by a further measurement device.

Thus, when performing an automated test in a test scenario in which multiple devices are involved, the set-up and the operation of the individual devices have to be synchronized with each other. In particular, the individual commands for automatically controlling each of the related devices have to be sent in an appropriate order.

Hence, there is a need for an automated generation of control commands for controlling multiple devices. In particular, there is a need for an automated generation of a control command sequence which can take into account a correct order for applying commands to multiple devices of a test arrangement.

SUMMARY

The present invention provides a command recording arrangement and a command recording method with the features of the independent claims. Further embodiments are subject of the dependent claims.

According to a first aspect, a command recording arrangement is provided. The command recording arrangement generates a command sequence related to at least two devices. The arrangement comprises a data interface and a command processor. The data interface is electrically connected to the at least two devices. The data interface is adapted to receive control commands from the at least two devices. Each control command is associated with a user input on one of the at least two devices. Each control command includes a timestamp related to the associated user input. The command processor is adapted to merge the received control commands to a common control sequence. The received control commands are arranged in the common control sequence based on the timestamps included in the received control commands. Further, an identification of the related device of the at least two devices may be added to each command in the common control sequence.

According to a second aspect, a control command recording method is provided. The command recording method generates a control command sequence related to multiple devices. The method comprises a step of receiving control commands from the at least two devices. The control commands may be received by a data interface. Each control command is associated with a user input on one of the at least two devices. Each control command includes a timestamp related to the associated user input. The method further comprises a step of merging the received control commands to a common control sequence. The merging may be performed by a command processor. The received control commands are arranged in the common control sequence based on the timestamps included in the received control commands. An identification of the related device of the at least two devices may be added to each command in the common control sequence.

As explained above, performing a fully or partially automated test in a test arrangement comprising multiple devices for testing a device under test, the operations of the individual devices have to be synchronized with each other. For example, a predetermined test signal has to be applied to the device under test, and a measurement of the response of the device under test has to be synchronized with the generation of the test signal. Thus, when performing an automated testing of a device under test, the commands for setting up and controlling the individual devices in such a test arrangement have to be applied in a correct order.

Based on this finding, the present invention aims to provide a smart and efficient generation of a control command sequence for controlling multiple devices of a test arrangement. For this purpose, user input on each of the multiple devices is monitored, and for each user input a corresponding control command is generated. Furthermore, the control commands of all related devices are merged together by taking into account the correct order of the individual control commands based on the points of time when the related user input is performed.

The at least two devices may be any kind of device related to a test procedure for testing a device under test. As will be described in more detail below, the devices may be, for example, devices for generating any kind of signal, in particular a signal which may be applied to the device under test. Furthermore, the devices may be also any kind of measurement device for measuring a signal of the device under test. Each of the devices may comprise a user interface for receiving user input from a user. For example, a user may input commands for setting up the device or initiate a predetermined operation, e.g. a generation of a test signal or starting or terminating a measurement operation. Each user input may be converted to a corresponding control command. The corresponding control command may be a command which can be used to automatically perform an operation in the respective device corresponding to the respective user input. Furthermore, a timestamp may be associated with each control command. The timestamp may specify the point of time when the user input has been received and/or when an operation corresponding to the user input has been executed at the respective device.

The control commands and the associated timestamps may be stored in a memory which is comprised in each of the at least two devices. In this case, the control commands and the associated timestamps may be sent to the data interface as a whole, i.e. all control commands and the corresponding timestamps are transferred from the memory to the data interface during a single transfer operation. Such a transfer operation may be performed, for example after a predetermined test operation has been completed. Alternatively, the data interface may initiate the transfer of the control commands and the timestamps, for example by an operation for reading out the data stored in the respective device. Alternatively, it may be also possible that each control command and the corresponding timestamp may be transferred from the device to the data interface separately. For example, each control command and the related timestamp may be sent after the respective control command has been generated. Accordingly, the data interface may receive each control command and the corresponding timestamp, separately.

The data interface may be any kind of interface for establishing a wired or wireless communication link with the at least two devices. For example, any kind of network connection or bus system may be used for connecting the devices and the data interface. Furthermore, a WLAN or Bluetooth connection may be used for transferring the control commands and the corresponding timestamps from the devices to the data interface. However, it is understood that any other kind of communication link between the devices and the data interface may be also possible. For example, the data interface may comprise a connector for connecting a cable in order to apply a wired connection to at least one of the devices. The connector may be any kind of connector which is appropriate for establishing a wired connection based on the desired communication standard. Furthermore, the data interface may comprise an antenna and a receiver for receiving wireless signals from at least one of the devices. Furthermore, the data interface may comprise any kind of appropriate elements for converting the received signals to data which can be used by the command processor for further processing. Further, the data interface may assign additional information to the received control command in order to specify the device from which the respective control command has been received. For example, a unique identification may be assigned to each received control command identifying the respective device. Alternatively, such an identification of the respective device may be already assigned to the control command at the respective device. In this way, it is possible to clearly identify in each control command the related device.

The command processor may merge the received control commands from the at least two devices to a common control sequence. For this purpose, the command processor may take into account the timestamps which are associated to each of the received control commands. Based on the timestamp, the command processor may arrange the individual control commands in an order corresponding to the order in which the user input has been performed on the at least two devices. Furthermore, the related device of the at least two devices may be also specified in the generated common control sequence. In this way, the common control sequence may be used to automatically execute a test sequence controlling all related devices. In particular, the individual operations and the set-up of the related devices are executed in a correct order.

Furthermore, it may be possible to additionally include commands in the common control sequence for applying a pause or interruption such that the individual control commands are performed in a timing which corresponds to the timing according to points of time the user has input the respective operations on the devices. Alternatively, it may be also specify appropriate time information in the common control sequence in order to perform the individual operations in a time sequence which corresponds to the time sequence of the user inputs and in particular to the delays according to the related user inputs. For this purpose, the individual control commands in the common control sequence may comprise relative time information or the like.

The command processor may comprise, for example, a general purpose processor with corresponding instructions. Further, the command processor may comprise interfacing elements that couple the processor with the data interface and/or further components, e.g. a memory for storing the common control sequence or the like. The processor may comprise instructions which cause the command processor to perform the merging of the received control commands. The instructions may be stored in an instruction memory that is coupled to the processor, e.g. via a memory bus. The processor may execute an operating system that loads and executes the instructions stored in the instruction memory. The processor may be, e.g. an Intel processor that runs a WINDOWS or Linux operating system that loads and executes the instructions. Alternatively, the processor may be a processor that runs an embedded operating system which loads and executes the instructions.

Further embodiments of the present invention are subject of the further subclaims and of the following description referring to the drawings.

In a possible embodiment, the data interface is adapted to assign an identification to the received control commands. The assigned identification may specify the device from which the respective control command has been received.

The assigned identification may be, for example a unique identification for specifying a particular device or a particular type of device. The identification may be any kind of identification, for example a number, an alphanumeric term or a binary code. By assigning such an identification to each received control command, it is possible to specify the related device which shall execute this command, when an automated test sequence has to be performed. In particular, by identifying the related device, it is possible to specify the related device out of multiple devices by handling a single, common control sequence.

In a possible embodiment, the command processor may be adapted to generate a program script. The program script may be executable on a processing device. The processing device may be directly or indirectly connected with the at least two devices. Further, the processing device may be configured to instruct the related devices to perform the control commands when executing the program script.

The program script may comprise, for example, instructions which can be executed by the processing device. For this purpose, the processing device may comprise a processor which can read and execute the instructions of the program script. For example, the program script may be specified in a predetermined programming language, for example Python, Perl or the like. However, it is understood that any other script language or programming language may be also possible. In this way, a very flexible and universal script for an automated test procedure can be provided.

In a possible embodiment, the command recording arrangement may comprise a time synchronization device.

The time synchronization device may be adapted to initiate a time synchronization of the at least two devices.

The synchronization of the time at the at least two devices may comprise, for example, providing a common time basis to each of the at least two devices. For this purpose, the time synchronization device may comprise a clock, e.g. a real time clock. Accordingly, an internal clock or timer in the at least two devices may be set to a same time basis. For example, a real-time clock may be applied in each of the two devices, and time synchronization may synchronize the time of all related real-time clocks. Alternatively, it may be also possible to acquire the time basis in each clock of the related at least two devices and to determine time differences between the individual clocks in the at least two devices. In this case, the determined time differences may be taken into account when merging the control commands to a common control command sequence. However, it is understood that any other kind of synchronization of the time basis in the at least two devices may be also possible.

In a possible embodiment, the at least two devices are comprised in the command recording arrangement. Each device of the at least two devices may comprise a user interface. The user interface may be adapted to receive a user input. The at least two devices may further comprise a conversion processor. The conversion processor may be adapted to translate the received user input to a control command. The control command may be a command for instructing device to perform an operation according to the related received user input. Each of the at least two devices may further comprise a clock. The clock may be adapted to assign timestamp information to each control command.

The timestamp information may specify a point of time when the corresponding user input has been received at the user interface. Additionally, or alternatively, timestamp information may specify a point of time when the user input is applied to the related device, i.e. when a set-up which has input on the user interface is applied to the related device, or a point of time when operation specified by the user input is started or executed.

In a possible embodiment, the at least two devices comprise at least one signal generation device. The signal generation device may be adapted to generate a test signal. Additionally, or alternatively, the at least two devices may comprise at least one measurement device. The measurement device may be adapted to measure a signal.

The signal generation device may be any kind of device which is appropriate for generating a test signal. The test signal may be any kind of wired or wireless test signal. The signal generation device may generate a direct current or alternating current test signal. In particular, the signal generation device may generate a radio-frequency test signal. For example, the test signal may be a test signal of a predetermined frequency. The test signal may be a modulated signal. However, it is understood that any other kind of test signal may be also possible.

The measurement device may be any kind of measurement device for measuring a wired or wireless signal. For example, the measurement device may be a spectrum analyzer, an oscilloscope or the like. The measurement device may receive a measurement signal and perform any kind of measurement of the received signal. For example, the measured signal may be converted to a digital signal, and the digital signal may be stored in a memory of the measurement device. However, it is understood that the present invention is not limited to the above-mentioned devices. Furthermore, any other kind of signal generation device and/or measurement device may be also possible.

In a possible embodiment, the at least two devices and the data interface are connected with each other by a local area network (LAN), a universal serial bus (USB), a controller area network (CAN) bus connection or a general purpose interface bus (GPIB).

Furthermore, any other kind of wired or even wireless communication link between the data interface and the at least two devices may be also possible. In one possible embodiment, each of the at least two devices may be connected separately with the data interface. Alternatively, a common network or bus system may be used for connecting the data interface and each of the two devices. Furthermore, it may be also possible that at least some of the at least two devices are connected with each other and only one or some of the at least two devices are connected with the data interface. In this way, a device of the at least two devices may be used as a relay for forwarding data from another device to the data interface.

In a possible embodiment, the control commands may comprise at least one of Standard Commands for Programmable Instruments (SCPI), Virtual Instrument Software Architecture (VISA) commands, Interchangeable Virtual Instruments (IVI) commands, or general purpose interface bus (GPIB) commands.

The above-mentioned commands may be implemented in a signal generation device or a measurement device, and thus, using such commands may serve as a basis for a very flexible automated test system. However, it is understood that any other kind of specification for defining control commands may be also applied.

In a possible embodiment, the data interface and/or the command processor are included in one of the at least two devices.

For example, the command recording by the data interface and the command processor may be included in a measurement device. Alternatively, the generation of the common control sequence may be also applied to a signal generation device. By including the command recording in one of the at least two devices, an efficient generation of a common control sequence for controlling multiple devices in a test scenario can be achieved. In this way, costs and space can be saved.

In a possible embodiment, the command recording arrangement may comprise an output device. The output device may be adapted to provide the merged control commands to a further device. Additionally or alternatively, the merged control commands may be provided to a user. For example, the merged control commands may be provided on a display. In this way, a user can verify the correct implementation of the control sequence. Furthermore, the common control sequence may be provided to a further device such as a processing device for executing the common control sequence on a computer system. Furthermore, it may be possible that the generated common control sequence may be stored and/or modified by means of an additional device. In this way, a generated common control sequence may be adapted or modified depending on further constraints.

With the command recording arrangement and method of the present invention it is therefore possible to automatically generate a common control sequence for controlling multiple devices in a test arrangement. In particular, a common control sequence can be automatically obtained by recording a manual user operation in the test arrangement. In particular, all operations performed once by a user can be brought in an appropriate order for a later automated execution. In this way, the automation of a test scenario requiring multiple test devices can be simplified and failures of a human being can be avoided.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
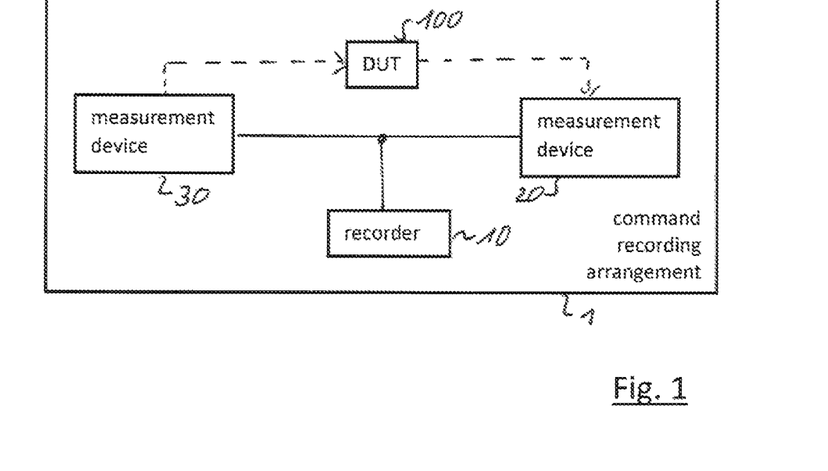
FIG. 1 shows a block diagram of an embodiment of an arrangement according to the present invention.

FIG. 1 shows a block diagram of an embodiment of a command recording arrangement 1 for generating a control command sequence. The arrangement 1 comprises at least two devices 20 and 30 for testing a device under test 100. For example, a first device 30 may generate a test signal which may be applied to the device under test 100. The test signal may be any kind of appropriate test signal. For example, the test signal may be a DC or AC signal. In particular, the test signal may be a test signal having a predetermined frequency. In particular, the test signal may be radio-frequency signal. Furthermore, the test signal may be a signal modulated with a predetermined modulation. However, it is understood that any other kind of appropriate test signal may be also generated by a signal generator 30. The generated test signal may be applied to the device under test 100. For example, the test signal may be applied to the device under test 100 by a number of one or more wired connections between the signal generator 30 and the device under test 100. For this purpose, any kind of appropriate wired connection, for example cables like coaxial cables or the like may be used. Furthermore, it may be also possible that an optical signal may be provided by an optical fiber or the like. Additionally or alternatively, it may be also possible to apply the test signal by a wireless link. For example, signal generator 30 may comprise an antenna for emitting wireless test signals. In this case, any kind of appropriate antenna or antenna system may be used. However, it is understood that the present invention is not limited to the above-mentioned wired or wireless test signals. Furthermore, any other kind of appropriate test signal may be generated by signal generator 30 and applied to the device under test 100.

Furthermore, the arrangement 1 may comprise at least one measurement device 20. Measurement device 20 may measure any kind of signal related with device under test 100. For example, measurement device 20 may measure a signal of device under test 100 by a number of one or more wired connections between device under test 100 and the measurement device 20. Additionally or alternatively, measurement device 20 may also receive and measure wireless signals emitted by device under test 100. For this purpose, measurement device 20 may comprise at least one antenna or an antenna system for receiving wireless signals. For example, measurement device 20 may be an oscilloscope, a spectrum analyzer, a vector analyzer or any other kind of appropriate measurement device.

The set-up and/or the operation of the at least two devices 20, 30, in particular signal generator 30 and measurement device 20 may be controlled by a user. For this purpose, the at least two devices 20, 30 may comprise user interfaces for receiving a user input and controlling the operation of the respective device based on the received user input. For example, a user may specify one or more characteristics of a test signal. Such characteristics may comprise frequency, amplitude, phase shift, duration, modulation or any other kind of parameter for characterizing a test signal. Furthermore, a user may specify on a measurement device 20, for example a sampling rate, a duration, a trigger event or any other parameter characterizing a measurement procedure performed by a measurement device 20. A user may perform such input before a measurement procedure is started and/or may input further operations while the measurement procedure is executed. For example, a user may increase or decrease one or more parameters or change the operation of the signal generator or the measurement device during the measurement procedure.

The information referring to each user input may be forwarded to a recorder 10. Based on the received information, recorder 10 may generate a common control sequence for automatically instructing all related devices 20, 30 to perform operations such as the operation specified by the manual user input. The configuration of the recorder 10 and the devices 20, 20 and the operation for requiring the common control sequence will be described in more detail below.

Figure 2:
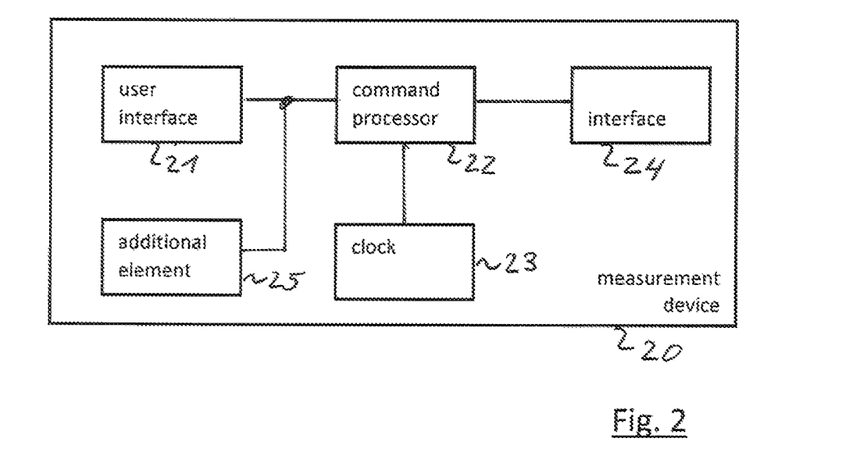
FIG. 2 shows a block diagram of signal generation of measurement device according to the present invention.

FIG. 2 shows a block diagram of a device 20 of the at least two devices 20, 30 for performing a test of the device under test 100. The device 20 may be any kind of appropriate signal generating or measurement device of the arrangement 1. Measurement device 20 may comprise a user interface 21, a conversion processor 22 and a clock 23. The device 20 may further comprise an interface 24 for communicatively coupling the device 20 with the recorder 10 and/or another device 20, 30. Furthermore, device 20 may comprise any kind of elements for testing the device under test 100. In particular, the additional elements 25 may comprise elements for generating a test signal and/or measuring a signal from the device under test 100.

User interface 21 may receive any kind of input from a user. In particular, the input of the user may specify set-up parameters or instructions for operating the device 20. As already mentioned above, the user input may specify parameters for characterizing a test signal or for performing a measurement of a signal received from a device under test 100. User interface 21 may forward the received user input to the elements 25 for performing the respective operations.

Furthermore, user interface 21 may also forward the received user input to a conversion processor 22.

Conversion processor 22 may receive the information relating to the user input and translate the received user input to a control command for instructing device 20 to perform an operation according to the received user input. Such a command may be specified, for example by commands according to a predetermined standard. For example, the control commands may be specified in Standard Commands for Programmable Instruments (SCPI), Virtual Instrument Software Architecture (VISA) commands, Interchangeable Virtual Instruments (IVI) commands or general purpose interface bus (GPIB) commands. However, it is understood that any other kind of standard for specifying commands may be also possible.

Command processor 22 may further acquire a point of time when the user input has been received from the user and assign a corresponding timestamp to the respective control command. For example, the point of time may be determined by a real-time clock, a counter or any other appropriate clock device 23 for specifying the point of time. Additionally or alternatively, command processor 22 may determine a point of time when the instructions of the user received by the user interface 21 are executed by device 20. For example, it may be possible that a user may enter multiple instructions or set-up parameters and subsequently, the user may enter a command for applying all these parameters together at a specified point of time. In such a case, command processor 22 may determine the point of time when the respective commands are executed by the device 20 and assign a timestamp corresponding to the point of time when the commands are executed. The generated control commands and the associated timestamps may be forwarded to recorder 10 by interface 24. In particular, each command and the corresponding timestamp may be directly forwarded upon control command and the timestamp are determined. However, it may be also possible to store the control commands and the related timestamps in a memory of device 20 and to transfer multiple control commands and related timestamps together to recorder 10 at a later point of time. Furthermore, any other scheme for transferring the control commands and the timestamps to recorder 10 may be also possible. In particular, it may be possible that information for specifying the related device 10 may be also assigned to the control commands and the timestamps before transferring the information to recorder 10. Alternatively, recorder 10 may determine from which device 20 the respective information has been received and in this case, recorder 10 may assign appropriate information for specifying the respective device 20. The information for specifying the device 20 may be any kind of appropriate information, for example a unique identifier, a number, an alphanumeric code, etc.

Figure 3:
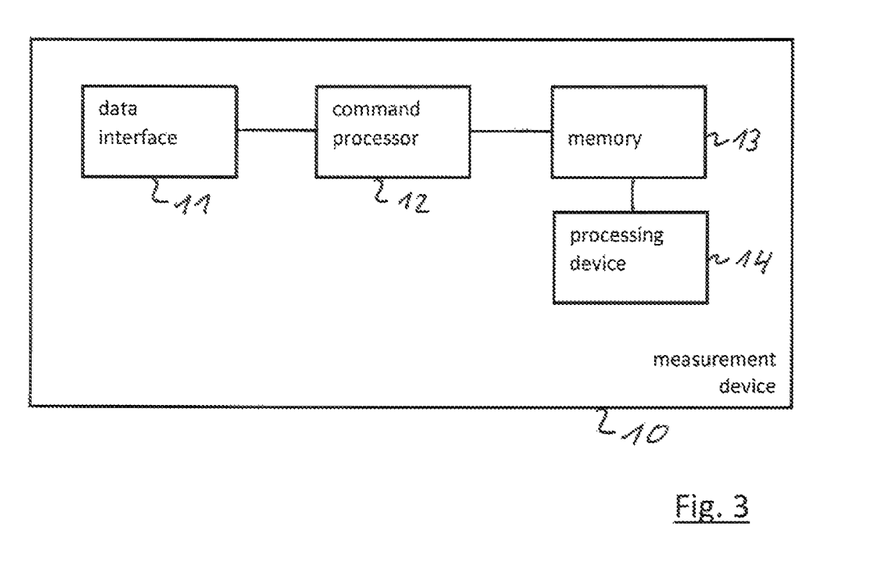
FIG. 3 shows a block diagram of recorder according to the present invention.

FIG. 3 shows a block diagram of recorder 10 of the command recording arrangement 1. Recorder 10 comprises a data interface 11 and a command processor 12. Further, recorder 10 may comprise a memory 13 and/or a processing device 14. Data interface 11 may be communicatively coupled with at least one or all of the at least two devices 20, 30. For example, a local area network (LAN), a universal serial bus (USB), a control area network (CAN) bus connection or a general purpose interface bus (GPIB) may be used for communicatively coupling data interface 11 of the recorder 10 and the at least two devices 20, 30. However, it is understood that any other kind of wired or even wireless communication may be also applied. Data interface 11 of the recorder 10 receives data from the at least two devices 20, 30, in particular from the signal generating devices and/or the measuring devices. As already described above, the received data comprise control commands corresponding to the user input at the user interface 21 of the respective device 20, and an associated timestamp. Furthermore, the received data may also comprise an identification of the respective device 20 to which the control command relates to. Alternatively, data interface 11 may determine from which device the respective control command has been received and based on this determination, data interface 11 may assign an appropriate identification to the received data. In this way, control commands from a plurality of devices 20, 30 may be received. Based on the assigned identification of the respective device, it can be determined at a later point of time to which device the respective control command relates.

The received control command and the assigned timestamp information together with the identification of the related device 20, 30 may be provided to command processor 12. Accordingly, command processor 12 obtains control commands with timestamp information from multiple devices 20, 30. Command processor 12 may merge the control commands from the multiple devices 20, 30 to a common control sequence. In particular, command processor 12 may consider the timestamp information of each received control command, and the control commands from the multiple devices 20, 30 are merged together in an order taking into account the related timestamp information. In particular, the common control sequence may comprise all control commands of the devices 20, 30 in an order which corresponds to the order by which the related user information has been entered at the user interface 21 of the devices 20, 30 and/or in order in which the user commands are executed by the devices 20, 30.

Since the multiple devices 20, 30 may be located at different spatial positions, it may be necessary to synchronize the time basis of the devices 20, 30. For example, recorder 10 or at least one of the devices 20, 30 may initiate a time synchronization process. During this time synchronization process, the clocks 23 of the devices 20, 30 may be set to a same time. For example, a synchronization signal may be transmitted to all related devices 20, 30, wherein the synchronization signal comprises the respective time information. However, any other scheme for setting the clocks 23 in all devices 20, 30 to a common time basis may be used. Furthermore, it may be also possible to identify differences between the time basis of the individual clocks 23 and to provide information regarding the time differences to recorder 10. According, recorder 10, in particular command processor 12 may take into account the time differences between the individual clocks when determining the order of the individual control commands for merging the control commands to the common control sequence.

Accordingly, the common control sequence may comprise a set of all control commands provided by the multiple devices 20, 30 during the recording operation, i.e. during the test procedure when a user manually inputs commands by the user interfaces 21 of the devices 20, 30. The common control sequence may comprise the control commands according to the related standard for specifying the control commands. Further, the common control sequence may comprise an identification of the related device 20, 30. In this way, it can be easily determined which device 20, 30 has to execute the respective control command. Furthermore, time information, for example relative time information may be included in the common control sequence in order to determine the appropriate point of time when the respective control command has to be executed. Alternatively, the control sequence may comprise additional commands between the individual control commands for applying an appropriate pause or time interval. It is understood, that any other scheme for specifying the absolute or relative point of time when a control command has to be executed may be also applied.

Furthermore, command processor 12 may generate a script comprising instructions for executing the respective control commands on the related devices 20, 30. For example, such a script may be provided in any appropriate script language. In particular Python, Perl or any other script language may be used for sending the control commands to the related devices 20, 30 at an appropriate point of time.

In order to perform an automated testing of a device under test 100, the common control sequence or the script may be provided to a processing device 14. Processing device 14 may be included in recorder 10. Alternatively, processing device 14 may be also located outside recorder 10 as a separate device, or processing device 14 may be implemented in one of the at least two devices 20, 30. Accordingly, processing device 14 may receive the script or the common control sequence and instruct all the related device 20, 30 according to the control command sequence or the script. Thus, the test of the device under test 100 may be performed automatically in a same manner as previously performed by means of user input at the related user interfaces 21.

For this purpose, recorder 10 may comprise an output interface for providing the script or the common control sequence to the processing device. Furthermore, the common control sequence or the script may be provided to a user on a display (not shown) of the recorder. In this way, a user may evaluate the recorded and merged control commands in order to verify whether the common control sequence has been recorded and merged correctly. Furthermore, it may be possible that a user may perform further amendments or corrections in the merged common control sequence.

In order to provide the merged common control sequence and/or the script for executing instructions to perform or the control commands in a correct order, the common control sequence and/or the script may be stored in a memory or another recording device inside or outside the recorder 10. For example, the script of the common control sequence may be stored in a nonvolatile memory, a hard disc drive or any other device for storing data.

Figure 4:
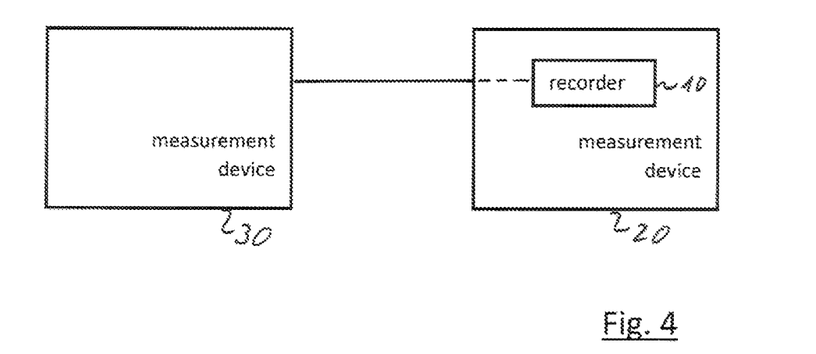
FIG. 4 shows an exemplary embodiment of another recording arrangement according to the present invention.

FIG. 4 shows a block diagram of a further command recording arrangement 1. The command recording arrangement 1 in FIG. 4 mainly corresponds to the previously described command recording arrangement. The arrangement 1 according to FIG. 4 differs from the previously described arrangement 1 in that recorder 10 is included in one device 20 of the multiple devices 20, 30. For example, recorder 10 may be included in a measurement device or a signal generator. Accordingly, the device 20 comprising recorder 10 may be communicatively coupled with the further devices 30 as already described above. Thus, the further explanation for acquiring control commands and merging the control commands to a common control sequence and generating a script also applies to the embodiment according to FIG. 4.

For sake of clarity in the following description of the method based FIG. 5 the reference signs used above in the description of apparatus based FIGS. 1-4 will be maintained.

Figure 5:
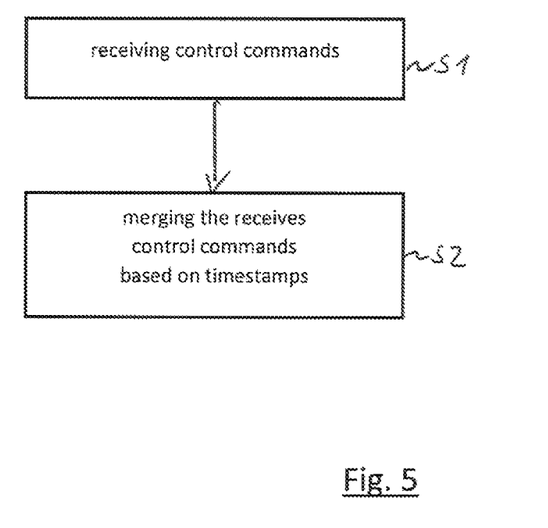
FIG. 5 shows a flow diagram of an embodiment of a recording method according to the present invention.

FIG. 5 shows a flow diagram of a command recording method.

The method may generate a control command sequence related to multiple devices 20, 30. The method comprises a step S1 of receiving control commands from the at least two devices 20, 30. The control commands may be received by a data interface 11. Each control command is associated with a user input on one of the at least two devices 20, 30. Each control command includes a timestamp related to the associated user input. The method further comprises a step S2 of merging the received control commands to a common control sequence. The merging may be performed by a command processor 12. The received control commands are arranged in the common control sequence based on the timestamps included in the received control commands. An identification of the related device of the at least two devices 20, 30 is included to each command in the common control sequence.

The method may comprise assigning an identification to the received control commands. The identification may specify the device 20, 30 from which the respective control command has been received.

The method may comprise generating a program script. The script may be generated by the command processor 12. The program script may be executable on a processing device 14 connected with at least two devices 20, 30. The processing device may be configured to instruct the devices 20, 30 to perform the control commands when executing the program script.

The method may comprise initiating a time synchronization of the at least two devices 20, 30.

The method may comprise receiving user input by the at least two devices 20 30, translating, by a conversion processor 12, the received user input to a control command for instructing device perform an operation according to the received user input, and assigning timestamp information to the control commands by the conversion processor 12.

The at least two devices 20, 30 may comprise at least one signal generation device for generating a test signal and/or at least one measurement device for measuring a signal.

The at least two devices 20, 30 and the data interface 11 may be connected with each other by a local area network (LAN), a universal serial bus (USB), a controller area network (CAN) bus connection or a general purpose interface bus (GPIB).

The control commands may comprise at least one of Standard Commands for Programmable Instruments (SCPI), Virtual Instrument Software Architecture (VISA) commands, Interchangeable Virtual Instruments (IVI) commands, or general purpose interface bus (GPIB) commands.

The merging the received control commands to a common control sequence may be performed in one of the at least two devices 20, 30.

The method may comprise providing the merged control commands to a further processing device or to a user.

Summarizing, the present invention relates to a recording of a control command sequence related to multiple devices. Each of the multiple devices may receive user input by a user interface, and the received user input may be converted to appropriate control commands. Timestamp information is assigned to each control command, and the control commands of the multiple devices are merged together to a common control command sequence based on the assigned timestamp information.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A command recording arrangement for generating a control command sequence related to a test procedure for testing a device under test in a test arrangement by at least two devices, wherein each of the at least two devices comprise:
   an input interface for receiving input corresponding to a control command; and
   a memory,
   wherein at least two inputs are converted to a separate control command for performing a predetermined operation or setting up the device receiving the control command,
   wherein at least two commands are used to perform an operation on the device receiving the control command in the test arrangement, and each of the at least two control commands includes a timestamp related to a point in time of an operation corresponding to the control command associated with respective input, and
   wherein each memory is configured to store the control commands and the associated timestamps of the respective device;
   the command recording arrangement comprising:
   a data interface electrically connected to the at least two devices, the data interface is adapted to receive control commands from the at least two devices, each control command being associated with the respective input on one of the at least two devices, wherein all control commands and the corresponding timestamps are transferred from the memories of the devices or streamed from the devices to the data interface during a transfer operation;
   a command processor adapted to merge the received control commands to a common control sequence, wherein the received control commands are arranged in the common control sequence based on the timestamps included in the received control commands, and an identification of a related device of the at least two devices in the test arrangement is included to each command in the common control sequence.

2. The command recording arrangement according to claim 1, wherein the data interface is adapted to assign an identification to the received control commands, said identification specifying the device from which the respective control command has been received.

3. The command recording arrangement according to claim 1, wherein the command processor is adapted to generate a program script, the program script being executable on a processing device connected with at least two devices, and the processing device is configured to instruct the devices to perform the control commands when executing the program script.

4. The command recording arrangement according to claim 1, comprising a time synchronization device adapted to initiate a time synchronization of the at least two devices.

5. The command recording arrangement according to claim 1, wherein each of the at least two devices comprises a conversion processor adapted to translate the received input to a control command for instructing device perform an operation according to the received input, and a clock for assigning timestamp information.

6. The command recording arrangement according to claim 5, wherein the at least two devices comprise at least one signal generation device for generating a test signal, and at least one measurement device for measuring a signal.

7. The command recording arrangement according to claim 5, wherein the at least two devices and the data interface are connected with each other by a local area network, a universal serial bus, a controller area network bus connection or a general purpose interface bus.

8. The command recording arrangement according to claim 5, wherein the control commands comprise at least one of Standard Commands for Programmable Instruments, Virtual Instrument Software Architecture commands, Interchangeable Virtual Instruments commands, or general purpose interface bus commands.

9. The command recording arrangement according to claim 1, wherein the data interface and the command processor are included in one of the at least two devices.

10. The command recording arrangement according to claim 1, comprising an output device for providing the merged control commands to a further processing device or to a user.

11. A command recording method for generating a control command sequence related to a test procedure for testing a device under test in the test arrangement by at least two devices, the method comprising:
    receiving input by each of the at least two devices;
    translating, by a conversion processor, the received input to a control command for instructing device perform an operation according to the received input;
    assigning timestamp information to the control commands by the conversion processor;

storing at least two control commands and the associated timestamps of the respective device in a memory of the respective device;

receiving at least two control commands from the at least two devices by a data interface, each of the at least two control commands being associated with an input on one of the at least two devices, at least two inputs are converted to a separate control command for performing a predetermined operation or setting up the device receiving the control command, the at least two control commands are used to perform an operation on the device receiving the control command in the test arrangement, and the at least two control commands include a timestamp related to a point in time of an operation corresponding to the received control command associated with respective input, wherein the at least two memories of the devices or streamed to the data interface during a transfer operation; and merging the received control commands to a common control sequence by a command processor, wherein the received control commands are arranged in the common control sequence based on the timestamps included in the received control commands, and an identification of a related device in the test arrangement of the at least two devices is included to each command in the common control sequence.

12. The method according to claim 11, comprising assigning an identification to the received control commands, the identification specifying the device from which the respective control command has been received.

13. The method according to claim 11, comprising generating a program script by the command processor, the program script being executable on a processing device connected with at least two devices, and the processing device being configured to instruct the devices to perform the control commands when executing the program script.

14. The method according to claim 11, comprising initiating a time synchronization of the at least two devices.

15. The method according to claim 11, wherein the at least two devices comprise at least one signal generation device for generating a test signal, and at least one measurement device for measuring a signal.

16. The method according to claim 11, wherein the at least two devices and the data interface are connected with each other by a local area network, a universal serial bus, a controller area network bus connection or a general purpose interface bus.

17. The method according to claim 11, wherein the control commands comprise at least one of Standard Commands for Programmable Instruments, Virtual Instrument Software Architecture commands, Interchangeable Virtual Instruments commands, or general purpose interface bus commands.

18. The method according to claim 11, wherein the merging the received control commands to a common control sequence is performed in one of the at least two devices.

19. The method according to claim 11, comprising providing the merged control commands to a further processing device or to a user.

\* \* \* \* \*